United States Patent
Nodo

(10) Patent No.: US 8,102,156 B2
(45) Date of Patent: Jan. 24, 2012

(54) DIFFERENTIAL AMPLIFIER CIRCUIT AND ELECTRIC CHARGE CONTROL APPARATUS USING DIFFERENTIAL AMPLIFIER CIRCUIT

(75) Inventor: Ippei Nodo, Osaka-fu (JP)

(73) Assignee: Ricoh Company, Ltd., Tokyo (JP)

( * ) Notice: Subject to any disclaimer, the term of this patent is extended or adjusted under 35 U.S.C. 154(b) by 915 days.

(21) Appl. No.: 11/896,898

(22) Filed: Sep. 6, 2007

(65) Prior Publication Data

US 2008/0061745 A1    Mar. 13, 2008

(30) Foreign Application Priority Data

Sep. 8, 2006    (JP) ................. 2006-244430

(51) Int. Cl.
*H02J 7/04* (2006.01)
*H03F 3/45* (2006.01)
(52) U.S. Cl. ............... 320/162; 320/164; 327/52
(58) Field of Classification Search ........... 320/162
See application file for complete search history.

(56) References Cited

U.S. PATENT DOCUMENTS

| | | | |
|---|---|---|---|
| 4,754,169 A | 6/1988 | Morris | |
| 7,592,855 B2 * | 9/2009 | Kamatani | 327/525 |
| 2005/0134230 A1 * | 6/2005 | Sato et al. | 320/136 |
| 2006/0164060 A1 * | 7/2006 | Itoh | 323/313 |

FOREIGN PATENT DOCUMENTS

| | | |
|---|---|---|
| JP | 60-233913 A | 11/1985 |
| JP | 02-034015 A | 2/1990 |
| JP | 3-181212 | 8/1991 |
| JP | 2962246 | 8/1999 |
| JP | 11-312930 A | 11/1999 |
| JP | 3003174 B2 | 11/1999 |
| JP | 2004-201197 A | 7/2004 |
| JP | 4254485 B2 | 2/2009 |
| JP | 4604299 B2 | 10/2010 |

* cited by examiner

*Primary Examiner* — Edward Tso
*Assistant Examiner* — Johali Torres Ruiz
(74) *Attorney, Agent, or Firm* — Dickstein Shapiro LLP

(57) ABSTRACT

A differential amplifier circuit comprises a first input transistor including a control electrode serving as a non-inversion input terminal and a second input transistor including a control electrode serving as an inversion input terminal. These first and second input transistors constitute a difference pair. A bias current generation circuit section is provided to generate a bias current flowing to the first and second input transistors. An offset adjustment circuit section is provided to adjust an input offset voltage appearing at these input terminals. The offset adjustment circuit section has an adjustment resistance formed from a first variable resistance inserted into a first current route connecting to the first input transistor and a second variable resistance inserted into a second current route connecting to the second input transistor. The bias current generation circuit section changes the bias current in accordance with a change in a value of the adjustment resistance.

19 Claims, 6 Drawing Sheets

PRIOR ART

DIFFERENTIAL AMPLIFIER CIRCUIT AND ELECTRIC CHARGE CONTROL APPARATUS USING DIFFERENTIAL AMPLIFIER CIRCUIT

CROSS REFERENCE TO RELATED APPLICATION

This application claims priority under 35 USC §119 to Japanese Patent Application No. 2006-244430, filed on Sep. 8, 2006, the entire contents of which are herein incorporated by reference.

BACKGROUND OF THE INVENTION

1. Field of the Invention

The present invention relates to a differential amplifier circuit including an offset adjustment circuit, and an electric charge control apparatus for charging a secondary battery using the differential amplifier circuit.

2. Discussion of the Background Art

Conventionally, an electric charge control apparatus that charges a secondary battery includes an electric charge current detection circuit to detect an electric charge current flown to the secondary battery as shown in FIG. 6. As shown, an electric charge current to be flown to the secondary battery flows into a resistance Rsen, and the resistance Rsen converts the electric charge current into a voltage. Specifically, a differential amplifier circuit 101, a PMOS transistor 102, and a plurality of resistances 103 and 104 collectively form a subtraction circuit and divide a both end voltage of the resistance Rsen to a voltage Vsen with reference to a ground. The voltage Vsen is then outputted. Specifically, the electric charge current detection circuit 100 converts an electric charge current to be supplied to the secondary battery into a ground reference voltage Vsen, and outputs the ground reference voltage. The electric charge control apparatus executes constant current electric charge to the secondary battery using the voltage Vsen.

When an offset voltage appearing in the differential amplifier circuit 101 varies, an electric charge current can't be precisely detected. Further, when constant current electric charging is executed while the resistance Rsen is minimized for the purpose of reducing heat generation, an electric charge current to be supplied to the secondary battery varies as a problem. Then, as shown in FIG. 7, a conventional differential amplifier circuit attempted to include a trimming adjustment circuit so as to adjust an offset voltage as described in the Japanese Patent Registration No. 2962246. Specifically, in the differential amplifier circuit 110 of FIG. 7, a parasitic offset voltage is adjusted by turning on and off a plurality of current flowing in route switches 116 and 117, as well as a switch line 119 that controls a resistance element line 118 as a trimming resistance.

For example, a method for adjusting an offset voltage when a polarity of a parasitic offset voltage, represented by a difference between voltages of differential input terminals 111g and 112g, is positive is executed as described below. Specifically, when a current flowing to a source of a PMOS transistor 112 is larger than that flowing to a source of a PMOS transistor 111, a switch 117 is open to be in a cut-off condition to limit a current flowing to the source of the PMOS transistor 112 (i.e., a current flowing to the source 114s of a NMOS transistor 114) in step 1. The switch 116, however, is closed and maintains a conductive state.

Then, when a switch line 119 is open from its end in turn to be a cut off condition, a resistance element joins a route of current flowing from the source 114s of the NMOS transistor 114 in turn. The parasitic offset voltage disappears when the resistance element is added in turn until a current flowing to the source 114s of the NMOS transistor 114 is equal to that flowing to the source 113s of the NMOS transistor 113. Specifically, the switch line 119 is turn off in turn from its end to be a cut off condition until the parasitic offset voltage disappears in the differential amplifier circuit in step 2. In this way, the offset voltage of the differential amplifier circuit in a positive direction can be adjusted by executing these steps 1 and 2 from the initial condition.

A voltage drop serving as an offset correction voltage Vadj created in the resistance element 118 after offset adjustment is executed is calculated by the following formula, when a current value of a current source 115 is i115, a resistance value of the resistance element line 118 after offset adjustment is executed is R118, and a performance of gate voltage versus drain current of each of the PMOS transistors 111 and 112 is substantially equal to that of each of the NMOS transistors 113 and 114 (in case a current direction is opposite);

$$Vadj \approx R118 \times i115/2$$

However, according to the offset adjustment circuit of FIG. 7, since the switch line 119 is turned off in turn from its end until the offset voltage disappears, while all of a plurality of unit resistances forming the adjustment resistance has the same resistance value and the minimum resolution of the offset adjustment voltage is necessarily generated, the resistance value is significantly small. Accordingly, when a range for adjusting the offset voltage is wide, a great number of unit resistances are necessarily connected serially, thereby a chip area is increased. When the number of unit resistances is decreased for the purpose of reducing a chip area, a resolution of the offset adjustment becomes rough, and precise offset adjustment becomes impossible. When the resolution is maintained, an adjustment range becomes narrower as a problem.

Further, it is well known that an adjustment resistance value is largely affected by a manufacturing process, and thereby largely varies. As shown in an adjustment circuit of FIG. 7, since such unevenness of manufacturing is neglected and due to such, the minimum resolution voltage for adjusting an offset voltage as well as a voltage adjustable range change. For example, when a resistance value decreasingly changes due to the manufacturing unevenness, the minimum resolution is maintained, whereas an adjustable offset voltage range becomes narrower. To the contrary, when a resistance value increasingly changes, a prescribed minimum resolution can't be likely obtained.

Further, when a value of a unit resistance is decreased in view of manufacturing unevenness while maintaining the adjustable offset voltage range, a number of the unit resistances increases, and accordingly, the chip area again increases as a problem. Further, as mentioned above, an adjustment resistance value after offset adjustment is executed changes due to change in temperature or time elapsing, a conventional offset adjustment circuit can't deals with these changes and results in creating an offset voltage.

SUMMARY

Accordingly, an object of the present invention is to improve such background arts technologies and provides a new and novel differential amplifier circuit. Such a new and novel differential amplifier circuit includes a first input transistor including a control electrode serving as a non-inversion input terminal, a second input transistor including a control electrode serving as an inversion input terminal thereby constituting a difference pair with the first input transistor and a bias current generation circuit section that generates a bias current flowing to the first and second input transistors. An offset adjustment circuit section is provided to adjust an input offset voltage appearing at the input terminals. The offset adjustment circuit section having an adjustment resistance (formed from a first variable resistance inserted into a first current route connecting to the first input transistor, and a second variable resistance inserted into a second current route connecting to the second input transistor). The bias current generation circuit section changes the bias current in accordance with a change in a value of the adjustment resistance.

In another embodiment, the first variable resistance includes at least two first resistances serially connected to each other, and at least two first trimming fuses correspondingly connected in parallel to the first resistances. The value of the first adjustment resistance is changed by selectively cutting said at least two first trimming fuses.

In yet another embodiment, the second variable resistance includes at least two second resistances serially connected to each other and at least two second trimming fuses correspondingly connected in parallel to the at least two second resistances. The value of the second adjustment resistance is changed by selectively cutting at least two second trimming fuses.

In yet another embodiment, a differential amplifier circuit comprises a first input transistor including a control electrode serving as a non-inversion input terminal, a second input transistor including a control electrode serving as an inversion input terminal thereby constituting a differential pair with the first input transistor, and a bias current generation circuit section that generates a bias current flowing to the first and second input transistors. An offset adjustment circuit section is provided to adjust an input offset voltage. The offset adjustment circuit section includes an adjustment resistance formed from a variable resistance connected between a first current route connecting to the first input transistor and a second current route connecting to the second input transistor. A connection switching circuit section is provided to switch connection of the adjustment resistance either to the first or second current route. The bias current generation circuit section changes the bias current in accordance with a change in the adjustment resistance.

In yet another embodiment, the variable resistance includes at least two resistances serially connected to each other and at the least two trimming fuses correspondingly connected in parallel to the at least two resistances. The value of the adjustment resistance is changed by selectively cutting the at least two trimming fuses.

In yet another embodiment, the connection switching circuit section includes a first cut off circuit that cuts off a connection between a connection section connecting the first input transistor to the adjustment resistance and the bias current generation circuit section, and a second cut off circuit that cuts off a connection between a connection section connecting the second input transistor to the adjustment resistance and the bias current generation circuit section. Each of the first and second cut off circuits includes a trimming fuse.

In yet another embodiment, the bias current generation circuit includes a bias current generation use resistance that changes a value of its own resistance in proportion to a change in a value of the adjustment resistance. A current control circuit is provided to control a current flowing to the bias current generation use resistance so that a voltage drop in the bias current generation use resistance becomes a prescribed amount. A proportional current generation circuit is provided to generate a current as a bias current in proportion to the current flowing from the current control circuit to the bias current generation use resistance.

In yet another embodiment, the proportional current generation circuit utilizes the current flowing from the current control circuit to the bias current generation use resistance as a bias current.

In yet another embodiment, the bias current generation use resistance is made of the same material as the adjustment resistance and is manufactured in the same process.

In yet another embodiment, the values of the resistances of the adjustment resistance are calculated by $K \times 2^n$, wherein K represents the minimum resistance value and n represents integral number.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein.

PREFERRED EMBODIMENTS OF THE PRESENT INVENTION

Figure 1:
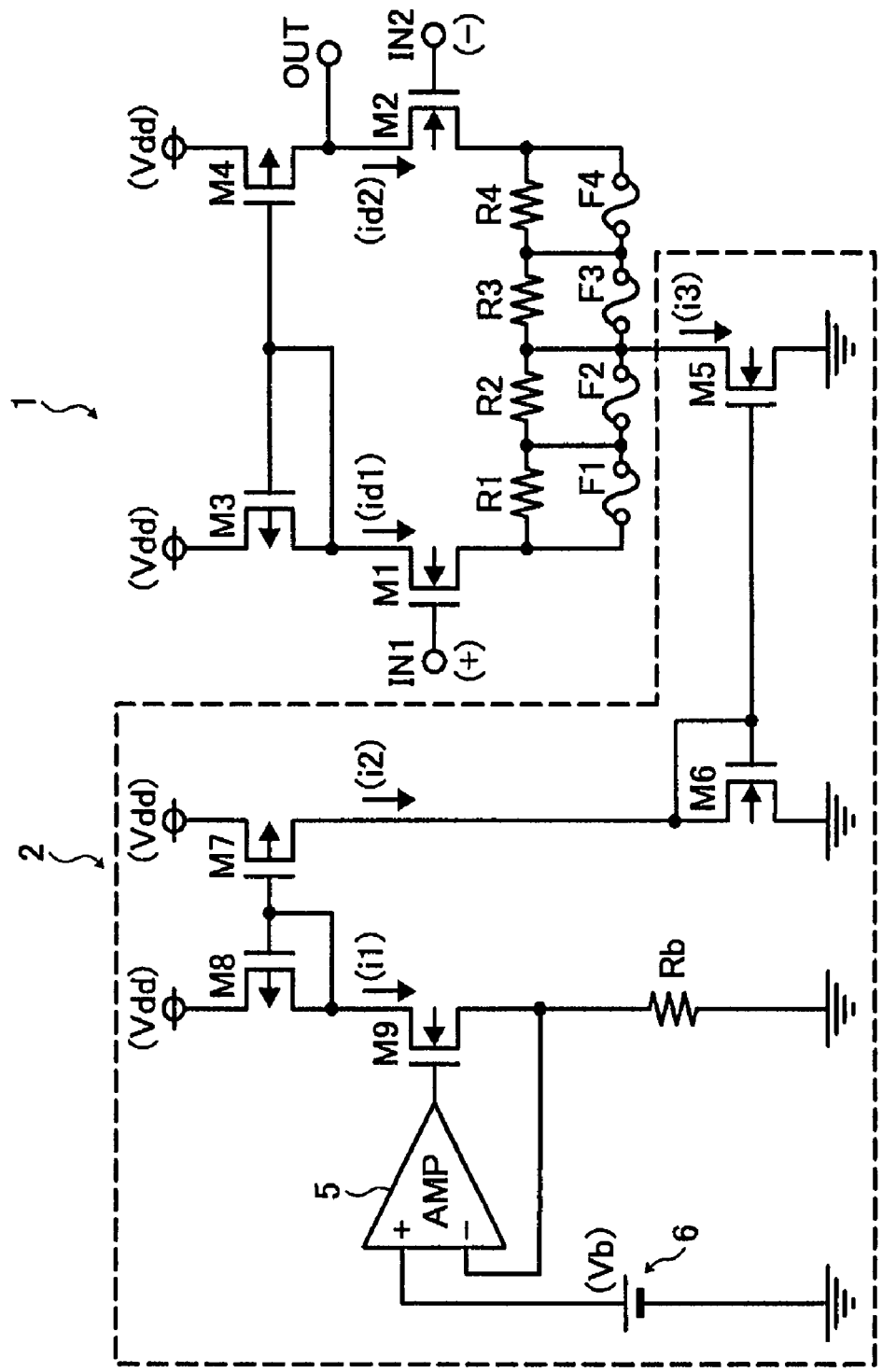
FIG. 1 illustrates an exemplary differential amplifier circuit according to the first embodiment of the present invention.

Referring now to the drawing, wherein like reference numerals designate identical or corresponding parts throughout several views, in particular in FIG. 1, an exemplary differential amplifier circuit according to the first embodiment is described. As shown, the differential amplifier circuit 1 includes a pair of NMOS type input transistors M1 and M2 forming a differential pair, a pair of PMOS transistors M3 and M4 forming a current mirror circuit serving as loads for the input transistors M1 and M2, a plurality of resistances R1 to R4 connected serially to each other serving as an adjustment resistance, a plurality of trimming fuses F1 to F4 correspondingly connected in parallel to the resistances R1 to R4, and a bias current source 2 for supplying a prescribed bias current to the input transistors M1 and M2. The bias current source 2 includes a calculation amplifier circuit 5, a reference voltage generation circuit 6 for generating and outputting a prescribed reference voltage Vb, a bias current generation use resistance Rb, a plurality of NMOS transistors M5, M6, and M9, and a plurality of PMOS transistors M7 and M8.

The input transistor M1 serves as the first input transistor. The input transistor M2 serves as the second input transistor. The bias current source 2 serves as a bias current generation circuit section. The resistances R1 to R4 and the fuses F1 to F4 serve as an offset adjustment circuit section. Further, the resistances R1 and R2 each serve as the first resistance. The fuses F1 and F2 each serves as the first trimming fuse. The resistances R3 and R4 each serve as the second resistance. The fuses F3 and F4 each serves as the second trimming fuse. Further, the resistance Rb serves as a bias current generation use resistance. The calculation amplifier circuit 5, the reference voltage generation circuit 6, and the NMOS transistor M9 collectively serve as a current control circuit. The NMOS transistors M5 and M6 and a pair of PMOS transistors M7 and M8 serve as a proportional current generation circuit.

The gates of the input transistors M1 and M2 are connected to the first input terminal IN1 that serves as a non-inversion input terminal of the differential amplifier circuit 1 and the second input terminal IN2 that serves as an inversion input terminal of the differential amplifier circuit 1, respectively. The drains of the input transistors M1 and M2 are correspondingly connected to the drains of the PMOS transistors M3 and M4, respectively. Each of the sources of the PMOS transistors M3 and M4 is connected to the power source voltage Vdd. The gates of the PMOS transistors M3 and M4 are connected to each other via a connection point, and the connection point is connected to the drain of the PMOS transistor M3.

A connection point connecting the drains of the input transistor M2 and the PMOS transistor M4 is connected to the output terminal OUT of the differential amplifier circuit 1. Between the sources of the input transistors M1 and M2, a plurality of resistances R1 to R4 is connected serially. A plurality of trimming fuses F1 to F4 are correspondingly connected in parallel to the resistances R1 to R4, respectively. Between a connection point connecting the resistances R2 and R3 and a ground, the NMOS transistor M5 is connected. The gate of the NMOS transistor M5 is connected to the gate of the NMOS transistor M6 at a connection point.

The connection point is connected to the drain of the NMOS transistor M6. The source of the NMOS transistor M6 is connected to a ground. Thus, the NMOS transistors M5 and M6 collectively form a current mirror circuit.

The drain of the NMOS transistor M6 is connected to the drain of the PMOS transistor M7. Further, each of the sources of the PMOS transistors M7 and M8 is connected to the power source voltage Vdd. The gates of the PMOS transistors M7 and M8 are connected to each other at a connection point. The connection point is connected to the drain of the PMOS transistor M8. The PMOS transistors M7 and M8 thereby form a current mirror circuit.

Between the drain of the PMOS transistor M8 and the ground, the NMOS transistor M9 and the resistance Rb are serially connected to each other. The gate of the NMOS transistor M9 is connected to the output terminal of the calculation amplifier circuit 5. Further, the reference voltage Vb is inputted to a non-inversion input terminal of the calculation amplifier circuit 5. An inversion input terminal of the calculation amplifier circuit 5 is connected to the connection point connecting the NMOS transistor M9 and the resistance Rb.

The resistance Rb is made of the same material as the resistances R1 to R4, and is manufactured in the same process. The resistances R1 to R4 can be the same value. However, cutting the fuses F1 to F4 enables only two kinds of offset adjustment as to the one side input terminal. Then, the value of the resistance R2 is increased to be twice the value of the R1, and values of the resistances R1 and R4 are equalized to each other. In addition, values of resistances of R2 and R3 are equalized to each other, similarly. As a result, three kinds of offset adjustment as to the one side terminal can be executed by appropriately cutting the fuses F1 to F4.

With such a configuration, the calculation amplifier circuit 5 controls the gate voltage of the NMOS transistor M9 and generates a drain current i1 of the NMOS transistor M9 so that voltage drop of the resistance Rb becomes the same to the reference voltage Vb. Thus, the drain current i1 is calculated by the following formula (1), wherein Rb represents a value of a resistance Rb;

$$i1 = Vb/Rb \quad (1)$$

The drain current i1 is turned back at the PMOS transistors M7 and M8, and is outputted as a drain current i2 of the PMOS transistor M7. When these PMOS transistors M7 and M8 have the same transistor performance with each other, the drain current i2 is equal to the drain current i1.

The drain current i2 is turned back at the NMOS transistors M5 and M6, and becomes a drain current of the NMOS transistor M5 and is further supplied to the respective input transistors M1 and M2 as a bias current i3. When a ratio between elements sizes of the NMOS transistors M5 and M6 is 1 versus 2, the bias current i3 is calculated by the following formula (2);

$$i3 = i1 \times 2 = 2 \times Vb/Rb \quad (2)$$

Since the bias current i3 flows to both the input transistors M1 and M2, the drain current id1 of the input transistor M1 and the drain current id2 of the input transistor M2 becomes almost the same as calculated by the following formula (3):

$$(Id) \approx (id2) \approx (id3/2) = Vb/Rb \quad (3)$$

Then, an appropriate bias voltage V1 is inputted to the first input terminal IN1, and gradually raises a voltage V2 of the second input terminal IN2 from zero voltages. Then, the voltage V2 is detected when a voltage of the output terminal OUT decreases. A difference between the voltages V1 and V2 serves as an input offset voltage Vof.

Since the drain current id1 is larger than the drain current id2 when the voltage V2 is higher than voltage V1, the adjustment resistance is inserted and connected to the source of the input transistor M1, and the drain current id1 is decreased. Specifically, in accordance with the offset voltage Vof, the fuses F1 and F2 are appropriately cut. When only the fuse F1 is cut, a voltage drop caused in the resistance R1 serves as an offset correction voltage Vadj as calculated by the following formula (4), wherein R1 and R2 represent values of resistances R1 and R2, respectively;

$$Vadj = R1 \times Vb/Rb \quad (4)$$

Further, the offset correction voltage Vadj is calculated by the following formula (5), when the fuse F2 is cut;

$$Vadj = R2 \times Vb/Rb \quad (5)$$

Further, the offset correction voltage Vadj is calculated by the following formula (6), when the fuses F1 and F2 are cut;

$$Vadj = (R1+R2) \times Vb/Rb \quad (6)$$

Specifically, an appropriate fuse cut combination is preferably selected so that an offset correction voltage Vadj closest to a detected offset voltage Vof can be obtained.

In contrast, since the drain current id2 is larger than the drain current id1 when the voltage 2 is lower than voltage 1, the adjustment resistance is inserted and connected to the source of the input transistor M2, and the drain current id2 is decreased.

Specifically, offset adjustment is similarly executed by cutting the fuse F4 instead of F3. Since when the resistances R1 to R4 serving as the adjustment resistance increase by 10% due to a change in a manufacturing process, the resistance Rb increases by 10% due to the same material and manufacturing process, an offset correction voltage Vadj is calculated by the following formula (7) when only the fuse F1 is cut;

$$Vadj = (R1 \times 1.1) \times Vb/(Rb \times 1.1) = R1 \times Vb/Rb \qquad (7)$$

As a result, the formula (7) becomes the same to the formula (4). Specifically, it is understood therefrom that the offset correction voltage Vadj does not change even if an adjustment resistance changes due to uneven manufacturing. The formula (5) calculated when only the fuse F2 is cut becomes the same to the formula (5) calculated when the fuses F1 and F2 are cut, and accordingly, affection of the uneven manufacturing can be suppressed or avoided. Apparently, even when a value of the adjustment resistance changes to be minus due to uneven manufacturing, affection of the uneven manufacturing can be suppressed or avoided, because the resistance Rb changes at the same ratio as mentioned above.

Specifically, even when a value of the adjustment resistance changes due to the uneven manufacturing, a voltage drop in the adjustment resistance is always constant, and an offset correction voltage Vadj closest to a detected offset voltage Vof can be set, because a bias current i3 changes so as to correct such a change. Further, even when a value of an adjustment resistance changes in accordance with a change in temperature during an operation of the differential amplifier circuit 1 or due to time elapsing, a change in offset correction voltage Vadj can be suppressed, because the resistance Rb similarly changes.

An exemplary modification of the differential amplifier circuit of the first embodiment is described with reference to FIG. 2, wherein only difference from the differential amplifier circuit of FIG. 1 is explained. Specifically, a difference of FIG. 2 from FIG. 1 is that a serial circuit of the adjustment resistance R1 to R4 is connected between the sources of the PMOS transistors M3 and M4, and a connection point connecting the resistances R2 and R3 is connected to the power source voltage Vdd. In addition, the sources of the input transistors M1 and M2 are connected to each other, and is further connected to the drain of the NMOS transistor M5.

Similar to the first embodiment as described with reference to FIG. 1, an appropriate voltage V1 is inputted to the first input terminal IN1, and gradually raises a voltage of the second input terminal IN2 from zero voltages. Then, a voltage V2 of the second input terminal IN2 is detected when a voltage of the output terminal OUT decreases. When the voltage V2 is higher than the voltage V1, the fuses F1 and/or F2 are cut in accordance with a difference in the voltage. When only the fuse F1 is cut, a voltage drop appears in the resistance R1 as calculated by the formula (4). When a performance of the gate voltage versus drain current of the PMOS transistor M3 is controlled to be the same to that of the gate voltage versus drain current of the input transistor M1 (when a current flowing direction is opposite), the voltage drop in the resistance R1 becomes an offset correction voltage Vadj. Further, when only the fuse F2 is cut, a voltage drop is as same as the offset correction voltage Vadj of the formula (5). When both of the fuses F1 and F2 are cut, a voltage drop is as same as the offset correction voltage Vadj of the formula (6). Specifically, these voltages serve as an offset correction voltage Vadj.

When the voltage V2 is lower than the voltage V1, offset adjustment can be similarly executed as above by alternately cutting fuses F3 and F4. Further, as in the first embodiment described above with reference to FIG. 1, since the resistance Rb is made of the same material as the adjustment resistances R1 to R4, and is manufactured in the same process, the offset correction voltage Vadj is not affected even if the value of the adjustment resistances changes due to unevenness of manufacturing and a change in temperature or the like.

In the first embodiment, for the purpose of simplicity, a number of adjustment resistances are two per one side and are totally four. However, the present invention is not limited to the above, and it is apparent that when numbers of adjustment resistances and fuses are increased, a number of selectable offset correction voltages Vadj can be increased. Further, by setting values of the resistances of the adjustment resistance to be a sequence of a power of two while using n items of adjustment resistances, $2^n$ kinds of resistance values including zero ohms can be set. Thus, a number of the adjustment resistances can be significantly decreased, and the chip area of an IC can be decreased.

Figure 2:
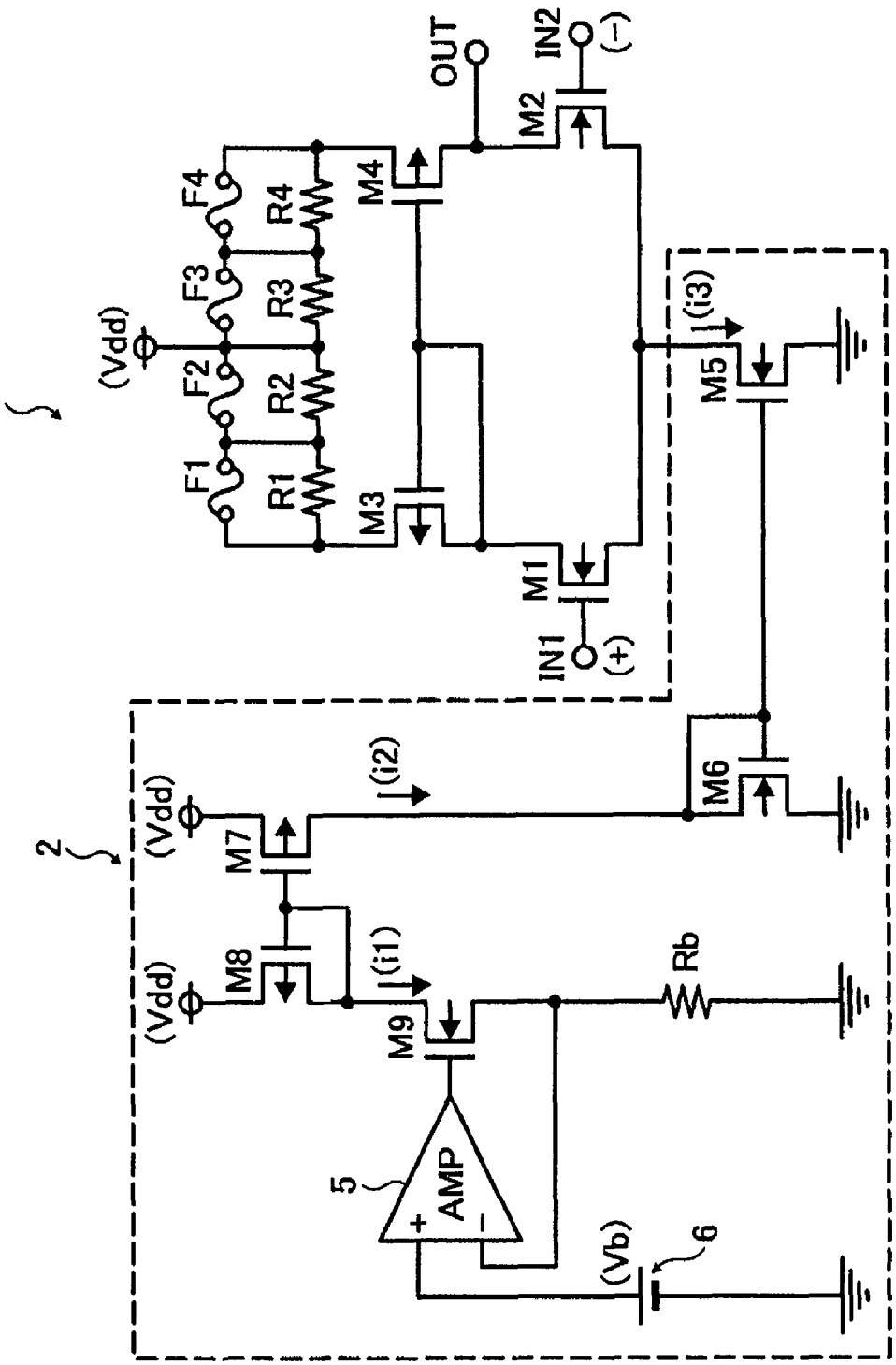
FIG. 2 illustrates an exemplary modification of the first embodiment according to the present invention.
Figure 3:
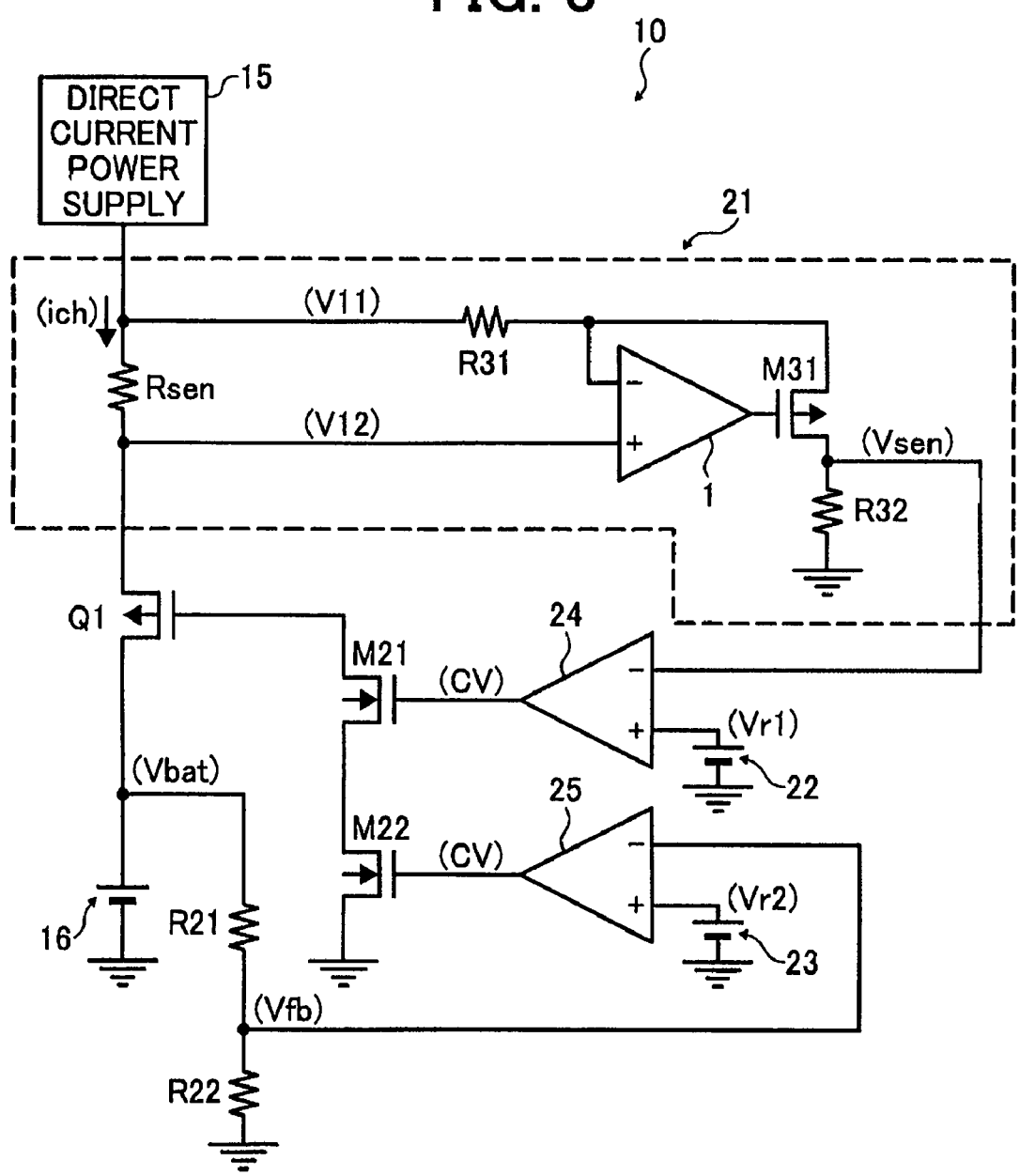
FIG. 3 illustrates an exemplary electric charge control apparatus for a secondary battery employing the differential amplifier circuit of one of FIGS. 1 and 2.

Now, an exemplary electric charge control apparatus for charging a secondary battery using a differential amplifier circuit as illustrated in FIGS. 1 and 2 is described with reference to FIG. 3. As shown there, an electric charge control apparatus employs a direct power source 15, such as an AC adopter, etc., as a power source, and executes a constant current or constant voltage electric charging to a secondary battery 16 such as a lithium ion battery, etc.

The electric charge control apparatus 10 includes an electric charge use transistor Q1 having a PMOS transistor for supplying a current to a secondary battery 16 in accordance with a signal inputted to a gate, a pair of resistances R21 and R22 for dividing a battery voltage Vbat serving as a voltage of the secondary battery 16 and outputting a division voltage Vfb, an electric charge current detection circuit 21 for detecting an electric charge current ich based on a both end voltage of the resistance Rsen, a first reference voltage generation circuit 22 for generating and outputting a prescribed first reference voltage Vr1, a second reference voltage generation circuit 23 for generating and outputting a prescribed second reference voltage Vr1, a pair of calculation amplifier circuits 24 and 25, and a pair of NMOS transistors M21 and M22. Further, the electric charge current detection circuit 21 includes a differential amplifier circuit 1, a PMOS transistor M31, and a plurality of resistances Rsen, R31, and R32. The resistance Rsen is used to detect a value of an electric charge current ich supplied to the secondary battery 16 from an electric charge use transistor Q1.

One end of the resistance Rsen is connected to a direct current power source 15. The electric charge use transistor Q1 is connected between the other end of the resistance Rsen and a positive side electrode of the secondary battery. The negative side of the secondary battery 16 is connected to the ground. The NMOS transistors M21 and M22 are serially connected between the gate of the electric charge use transistor Q1 and the ground. In the calculation amplifier circuit 24, a first reference voltage Vr1 is inputted to the non-inversion input terminal, and an output signal Vsen outputted from the electric charge current detection circuit 21 is inputted to the inversion input terminal. An output terminal of the calculation amplifier circuit 24 is connected to the gate of the NMOS transistor M21.

Further, in the calculation amplifier circuit 25, a second reference voltage Vr2 is inputted to the non-inversion input terminal, and a division voltage Vfb is inputted to an inversion input terminal. An output terminal of the calculation amplifier circuit 25 is connected to the gate of the NMOS transistor M22.

Further, between the direct current power source 15 side of the resistance Rsen and the ground, a resistance R31, a PMOS transistor M31, and a resistance R32 are serially connected. The gate of the PMOS transistor M31 is connected to an output terminal of the differential amplifier circuit 1. In the differential amplifier circuit 1, a non-inversion input terminal is connected to a connection section connecting the resistance Rsen and the electric charge use transistor Q1. An inversion terminal is connected to a connection section connecting the resistance R31 and the PMOS transistor M31. The output signal Vsen is outputted from a connection section connecting the PMOS transistor M31 and the resistance R32.

In such a configuration, when the battery voltage Vbat of the secondary battery 16 is low, and the division voltage Vfb is lower than the second reference voltage vr2, an output signal CV outputted from the calculation amplifier circuit 25 becomes high, and the NOMOS transistor M22 is turned on. The calculation amplifier circuit 24 controls an electric charge current ich as a drain current of the electric charge use transistor Q1 so that the output signal Vsen becomes the same to the first reference voltage Vr1. Specifically, a constant current electric charge is executed to the secondary battery 16 using the drain current ich.

When the division voltage Vfb becomes higher than the second reference voltage Vr2, the voltage of the output signal CV decreases, and the calculation amplifier circuit 25 controls the electric charge use transistor Q1 via the NMOS transistor M22 so that the division voltage Vfb becomes as same as the second reference voltage Vr2. Thus, a constant voltage electric charge is executed. Since a drain current ich of the electric charge use transistor Q1 decreases much more when the constant voltage electric charge is executed in comparison to when a constant current electric charge is executed. The signal Vsen becomes less than the first reference voltage Vr1. Thus, an output signal CC from the calculation amplifier circuit 24 becomes high and the NMOS transistor M21 is turned on, thereby the constant current electric charge is completed. Then, the drain current ich starts the constant voltage electric charging.

Further, in the electric charge current detection circuit 21, a voltage drop in the resistance Rsen is inputted, and is amplified at a rate as determined from a ratio between the resistances R31 and R32. Further, a signal Vsen obtained by converting into a voltage with reference to the ground is outputted from a connection section connecting the PMOS transistor M31 to the resistance R32. When a voltage of the connection section connecting the direct current power source 15 to the resistance Rsen is represented by V11, and a voltage of the connection section connecting the resistance Rsen to the electric charge use transistor Q1 is represented by V12, the voltage of the signal Vsen is calculated by the following formula (8), wherein R31 and R32 represent values of the resistances R31 and R32, respectively:

$$Vsen=(V11-V12)\times R32/R31 \quad (8)$$

Using the differential amplifier circuit 1, unevenness of an offset voltage of the differential amplifier circuit 1 can be significantly reduced. Accordingly, since a difference in both end voltages of the resistance Rsen created when the electric charge current ich flows to the secondary battery 16 can be precisely detected, a value of the resistance Rsen can be minimized and heat generation can be suppressed.

Thus, according to the first embodiment of the differential amplifier circuit, even when a value of the adjustment resistance (R1 to R4) for adjusting an input offset voltage changes due to uneven manufacturing, an offset correction voltage Vadj closest to a detected offset voltage Vof can be set, because the bias current i3 to be supplied to a differential pair changes to cancel the changes, and accordingly, the voltage drop of the adjustment resistance is always constant. Further, even when an adjustment resistance (R1 to R4) changes in accordance with a change in temperature during an operation of the differential amplifier circuit 1 or due to time elapsing, a change in offset correction voltage Vadj can be suppressed, because a value of the resistance Rb for bias current generation use also similarly changes. Accordingly, offset adjustment can be executed avoiding affection to resolution of an offset voltage caused by the uneven manufacturing and is independent from a change in temperature and time elapsing.

Now, the second embodiment is described with reference to FIG. 4. As shown there, an exemplary differential amplifier circuit according to the second embodiment is illustrated. A difference of a differential amplifier circuit of FIG. 4 from that in FIG. 1 is that the resistance R4 and the fuse F4 are omitted, whereas a fuse Fa is inserted between a connection section connecting an input transistor M1 to a resistance R1 and a drain of a NMOS transistor M5, and a fuse Fb is connected between a connection section connecting an input transistor M2 to a resistance R3 and the drain of the NMOS transistor M5. Thus, the differential amplifier circuit 1a is the same as that in FIG. 1 except for the reference number assigned.

Figure 4:
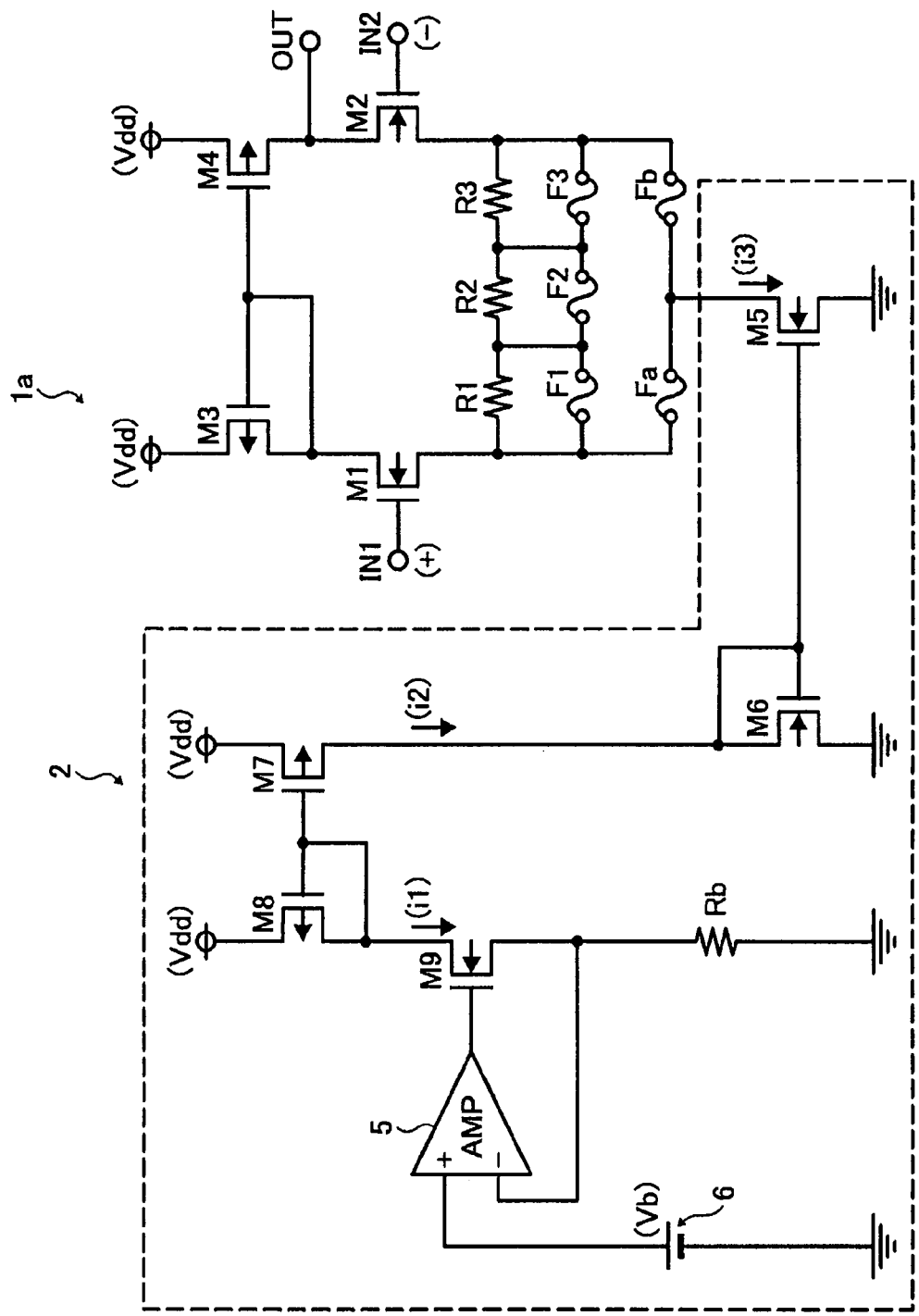
FIG. 4 illustrates an exemplary differential amplifier circuit according to the second embodiment of the present invention.

In FIG. 4, the differential amplifier circuit 1a includes a pair of input transistors M1 and M2, a pair of PMOS transistors M3 and M4, and a plurality of resistances R1 to R3 connected serially to each other to serve as an adjustment resistance. Also included in the differential amplifier circuit 1a are a plurality of fuses F1 to F3, Fa and Fb, as well as a bias current source 2.

The resistances R1 to R3 and the fuses F1 to F3 serve as a variable resistance and an offset adjustment circuit section.

The fuses Fa and Fb serve as a first and second cut off circuits, respectively.

A plurality of the resistances R1 to R3 are serially connected to each other between sources of the input transistors M1 and M2. A plurality of the trimming fuses F1 to F3 is connected in parallel to the resistances R1 to R3, correspondingly. The fuse Fa is connected between the source of the input transistor M1 and the drain of the NMOS transistor M5, while the fuse Fb is connected between the source of the input transistor M2 and the drain of the NMOS transistor M5. Similar to the first embodiment as described with reference to FIG. 1, an appropriate bias voltage V1 is inputted to the first input terminal IN1 and raises a voltage in the second input terminal IN2 gradually from zero volts. Then, the voltage V2 is detected when a voltage of the output terminal OUT decreases.

When the voltage V2 is higher than the voltage V1, the fuse Fa is initially cut, and the resistances R1 to R3 are serially connected between the source of the NMOS transistor M1 and the drain of the NMOS transistor M5. Since the fuse Fb is not cut, the source of the NMOS transistor M2 is connected to the drain of the NMOS transistor M5 via a resistance of Zero ohms. In contrast, when the voltage V2 is lower than the voltage V1, the fuse Fb is cut, and the resistances R1 to R3 are serially connected between the source of the NMOS transistor M2 and the drain of the NMOS transistor M5. Since the fuse Fa is not cut, the source of the NMOS transistor M1 is connected to the drain of the NMOS transistor M5 via a resistance of Zero ohms.

Then, in accordance with an offset voltage Vof detected, i.e., a differential voltage between the voltages V1 and V2, the fuses F1 to F3 are selectively cut. Similar to the first embodiment, a value of each of the resistances R1 to R3 can be the same, or can be set to be a sequence of raising by two. However, when the resistance values are the same, a setting number of adjustment resistances is four, where as when the resistance value is set to the sequence of a power of two, that of adjustment resistances increases to eight. Similar to the first embodiment, the resistances R1 to R3 are made of the same material as the resistance Rb for bias current generation use, and are manufactured in the same manufacturing process. Thus, even if the resistance value changes due to uneven manufacturing and a change in temperature or the like, the offset correction voltage Vadj is not affected.

Figure 5:
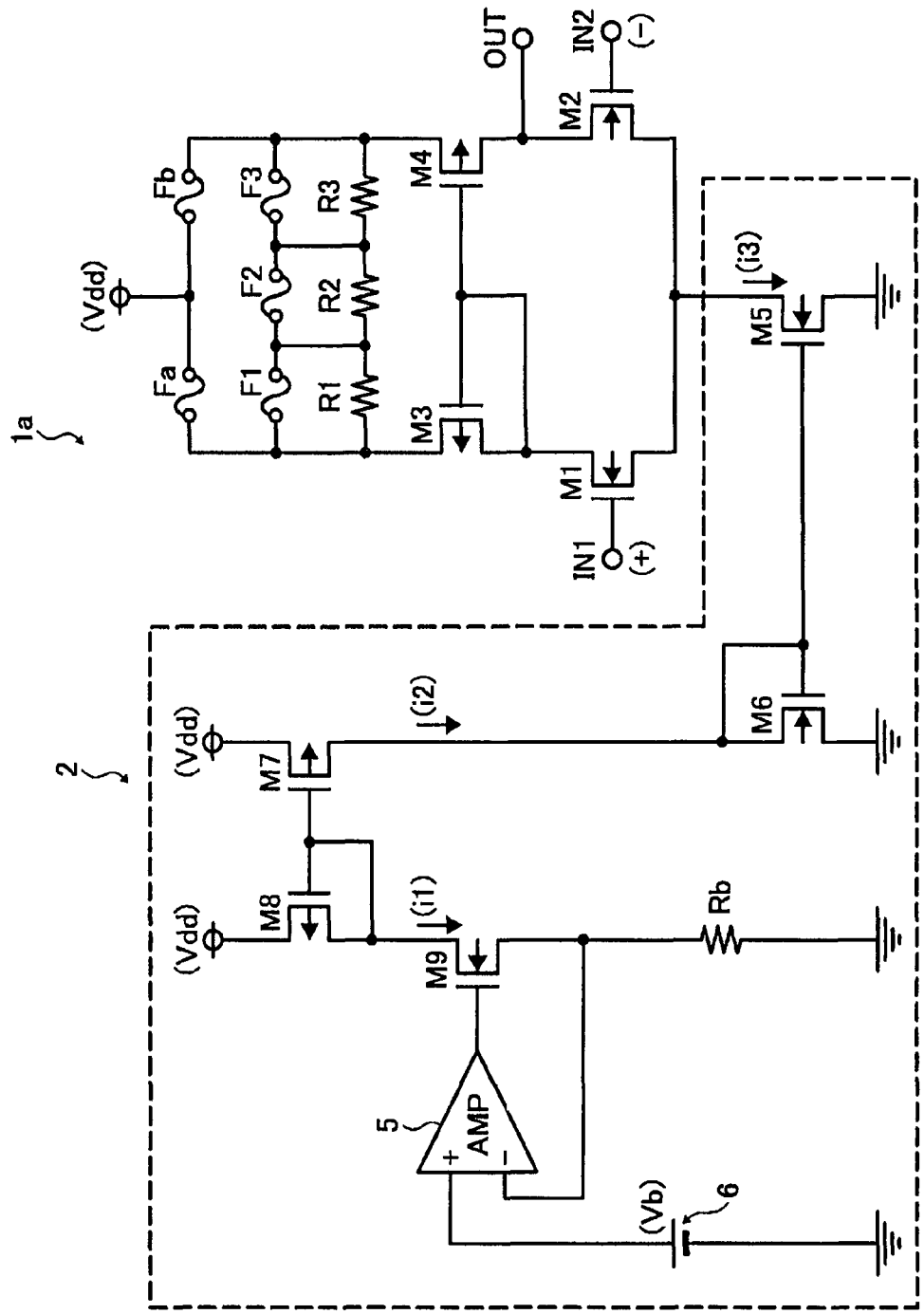
FIG. 5 illustrates an exemplary modification of the second embodiment according to the present invention.
Figure 6:
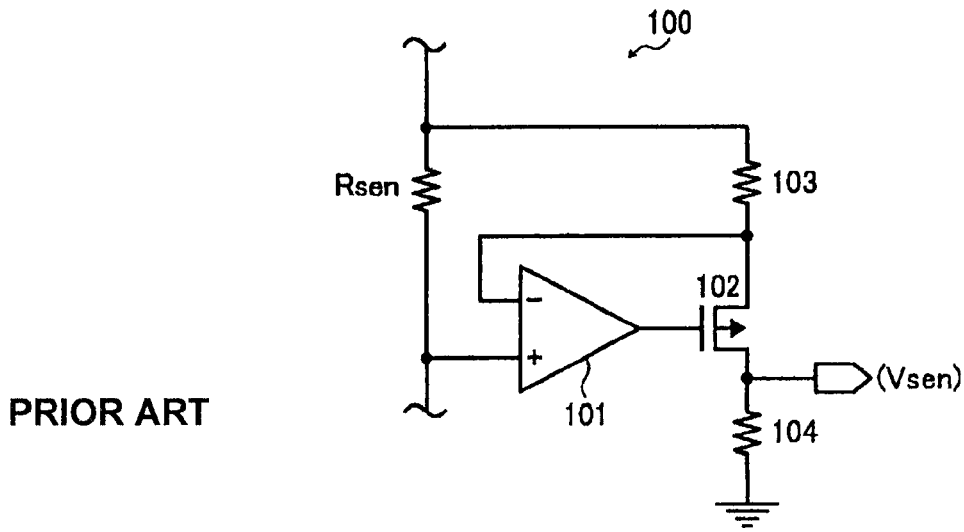
FIG. 6 illustrates a conventional electric charge current detection circuit.
Figure 7:
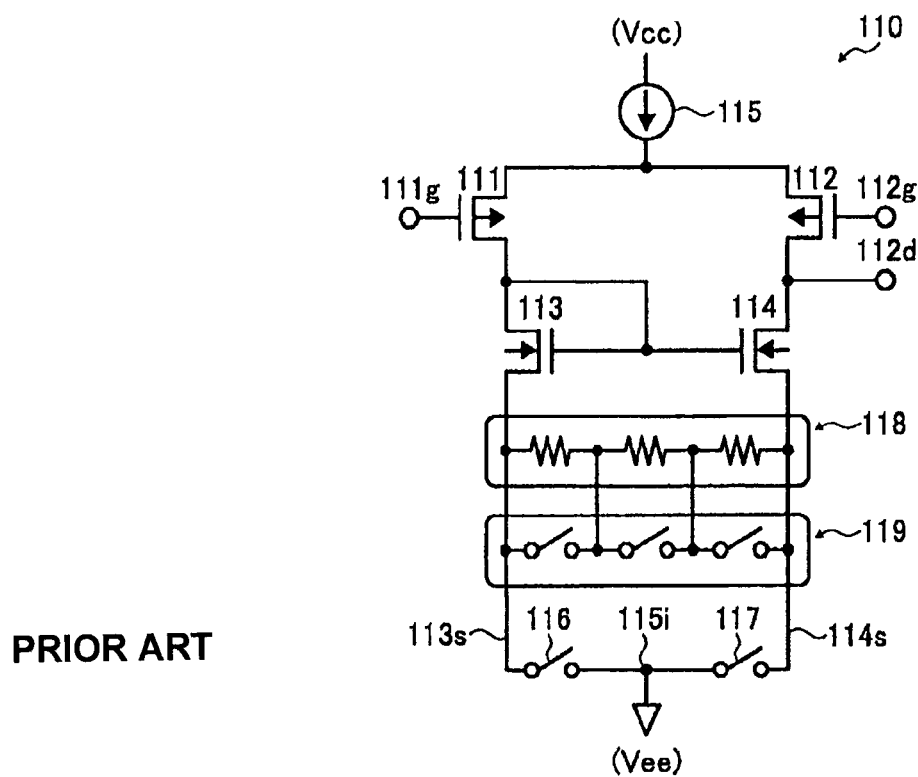
FIG. 7 illustrates a conventional differential amplifier circuit.

Now, a modification of the differential amplifier circuit of the second embodiment is described with reference to FIG. 5. A difference of a differential amplifier circuit of FIG. 5 from that in FIG. 4 is that a serial circuit of the resistances R1 to R3 is connected between the sources of the PMOS transistors M3 and M4, and a fuse Fa is inserted between a power source voltage Vdd and the source of the PMOS transistor M3, and a fuse Fb is inserted between the power source voltage Vdd and the source of the PMOS transistor M4. Another difference is that the sources of the input transistors M1 and M2 are connected to each other, and are further connected to the drain of the NMOS transistor M5.

Similar to the first embodiment described with reference to FIG. 4, an appropriate bias voltage V1 is inputted to the first input terminal IN1 and gradually raises a voltage of the second input terminal IN2 from zero volts. Then, the voltage V2 is detected when a voltage of the output terminal OUT decreases. When the voltage V2 is higher than the voltage V1, the fuse Fa is initially cut, and the resistances R1 to R3 are serially connected between the source of the PMOS transistor M3 and the power source voltage Vdd.

Since the fuse Fb is not cut, the source of the PMOS transistor M4 is connected to the power source voltage Vdd via a resistance of zero ohms.

In contrast, when the voltage V2 is lower than the voltage V1, the fuse Fb is initially cut, and the resistances R1 to R3 are serially connected between the source of the PMOS transistor M4 and the power source voltage Vdd. Since the fuse Fa is not cut, the source of the PMOS transistor M3 is connected to the power source voltage Vdd via a resistance of Zero ohms. Then, in accordance with an offset voltage Vof detected, i.e., a difference between the voltages V1 and V2, the fuses F1 to F3 are selectively cut. As shown in FIGS. 4 and 5, an electric charge control apparatus charging a secondary battery using a differential amplifier circuit is almost the same as in the first embodiment as described with reference to FIG. 3. According to the differential amplifier circuit of this embodiment, since the resistance R4 and the fuse F4 are omitted from the first embodiment, the same advantage is obtained as in the first embodiment while decreasing both a number of resistances forming the adjustment resistance and a chip area.

Although the second embodiment employs three resistances for the adjustment resistance for the purpose of ease of the description, the present invention is not limited thereto, and includes various modifications. For example, a number of selectable offset correction voltages Vadj can be increased by increasing numbers of resistances forming the adjustment resistance and fuses. Further, by setting a value of each of the resistances forming and adjustment resistance to be a sequence of a power of two and using n items of resistance, $2^n$ kinds of resistance values including zero ohms can be set. Thus, a number of resistances forming the adjustment resistance can be widely decreased, and the chip area for an IC can accordingly be decreased.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A differential amplifier circuit, comprising:
a first input transistor including a control electrode serving as a non-inversion input terminal;
a second input transistor including a control electrode serving as an inversion input terminal, said second input transistor constituting a difference pair with the first input transistor;
a bias current generation circuit section configured to generate a bias current flowing to the first and second input transistors; and
an offset adjustment circuit section configured to adjust an input offset voltage appearing at said input terminals, said offset adjustment circuit section having an adjustment resistance formed from a first variable resistance inserted into a first current route connecting to the first input transistor, and a second variable resistance inserted into a second current route connecting to the second input transistor;
wherein said bias current generation circuit section changes the bias current in accordance with a change in a value of the adjustment resistance and said bias current generation circuit section comprises:
a bias current generation use resistance configured to change a value of its own resistance in proportion to a change in a value of the adjustment resistance;
a current control circuit configured to control a current flowing to the bias current generation use resistance so that a voltage drop in the bias current generation use resistance becomes a prescribed amount; and
a proportional current generation circuit configured to generate a current as a bias current in proportion to the current flowing from the current control circuit to the bias current generation use resistance.

2. The differential amplifier circuit as claimed in claim 1, wherein said first variable resistance includes at least two first resistances serially connected to each other, and at least two first trimming fuses correspondingly connected in parallel to the first resistances; and wherein said value of the first variable resistance is changed by selectively cutting said at least two first trimming fuses.

3. The differential amplifier circuit as claimed in claim 1, wherein said second variable resistance includes at least two second resistances serially connected to each other, and at least two second trimming fuses correspondingly connected in parallel to the at least two second resistances; wherein said value of the second variable resistance is changed by selectively cutting said at least two second trimming fuses.

4. The differential amplifier circuit as claimed in claim 1, wherein said proportional current generation circuit utilizes the current flowing from the current control circuit to the bias current generation use resistance as a bias current.

5. The differential amplifier circuit as claimed in claim 1, wherein said bias current generation use resistance is made of the same material as the adjustment resistance and is manufactured in the same process.

6. The differential amplifier circuit as claimed in claim 1, wherein values of said resistances of the adjustment resistance are calculated by $K \times 2^n$, wherein K represents the minimum resistance value and n represents integral number.

7. An electric charge control apparatus, comprising:
an electric charge current detection circuit configured to detect an electric charge current supplied to a secondary battery through an electric charge current detection use resistance by converting a both end voltage of the electric charge current detection use resistance into a voltage with reference to a ground using a subtraction circuit having a differential amplifier circuit;

wherein said secondary battery is electrically charged by controlling the electric charge current based on an output signal outputted from the electric charge current detection circuit, and wherein said differential amplifier circuit including:

a first input transistor including a control electrode serving as a non-inversion input terminal;

a second input transistor including a control electrode serving as an inversion input terminal, said second input transistor constituting a difference pair with the first input transistor;

a bias current generation circuit section configured to generate a bias current flowing to the first and second input transistors; and an offset adjustment circuit section configured to adjust an input offset voltage appearing at said input terminals, said offset adjustment circuit section having an adjustment resistance formed from a first variable resistance inserted into a first current route connecting to the first input transistor, and a second variable resistance inserted into a second current route connecting to the second input transistor;

wherein said bias current generation circuit section changes the bias current in accordance with a change in a value of the adjustment resistance and said bias current generation circuit section comprises:

a bias current generation use resistance configured to change a value of its own resistance in proportion to a change in a value of the adjustment resistance;

a current control circuit configured to control a current flowing to the bias current generation use resistance so that a voltage drop in the bias current generation use resistance becomes a prescribed amount; and a proportional current generation circuit configured to generate a current as a bias current in proportion to the current flowing from the current control circuit to the bias current generation use resistance.

8. The electric charge control apparatus as claimed in claim 7, wherein said first variable resistance includes at least two first resistances serially connected to each other, and at least two first trimming fuses correspondingly connected in parallel to the first resistances; and wherein said value of the first variable resistance is changed by selectively cutting said at least two first trimming fuses.

9. The electric charge control apparatus as claimed in claim 7, wherein said second variable resistance includes at least two second resistances serially connected to each other, and at least two second trimming fuses correspondingly connected in parallel to the at least two second resistances; wherein said value of the second variable resistance is changed by selectively cutting said at least two second trimming fuses.

10. The electric charge control apparatus as claimed in claim 7, wherein said proportional current generation circuit utilizes the current flowing from the current control circuit to the bias current generation use resistance as a bias current.

11. The electric charge control apparatus as claimed in any one of claims 7 and 10, wherein said bias current generation use resistance is made of the same material as the adjustment resistance and is manufactured in the same process.

12. The electric charge control apparatus as claimed in claim 7, wherein values of said resistances of the adjustment resistance are calculated by $K \times 2^n$, wherein K represents the minimum resistance value and n represents integral number.

13. A differential amplifier circuit, comprising:

an offset adjustment circuit configured to adjust an input offset voltage across a difference pair formed by a non-inversion input transistor and an inversion input transistor by adjusting an adjustment resistance between the transistors; and a bias current generation circuit configured to generate a bias current that changes in accordance with a change in a value of the adjustment resistance flowing to the non-inversion and inversion input transistors, said bias current generation circuit comprising:

a bias current generation use resistance configured to change a value of its own resistance in proportion to a change in a value of the adjustment resistance;

a current control circuit configured to control a current flowing to the bias current generation use resistance so that a voltage drop in the bias current generation use resistance becomes a prescribed amount; and a proportional current generation circuit configured to generate a current as a bias current in proportion to the current flowing from the current control circuit to the bias current generation use resistance.

14. The differential amplifier circuit of claim 13, wherein the adjustment resistance is formed from a first variable resistance in a first current route coupled to the non-inversion input transistor and a second variable resistance in a second current route coupled to the inversion input transistor.

15. The differential amplifier circuit as claimed in claim 14, wherein said first variable resistance includes at least two first resistances serially connected to each other, and at least two first trimming fuses correspondingly connected in parallel to the first resistances; and wherein said value of the first variable resistance is changed by selectively cutting said at least two first trimming fuses.

16. The differential amplifier circuit as claimed in claim 14, wherein said second variable resistance includes at least two second resistances serially connected to each other, and at least two second trimming fuses correspondingly connected in parallel to the at least two second resistances; wherein said value of the second variable resistance is changed by selectively cutting said at least two second trimming fuses.

17. The differential amplifier circuit as claimed in claim 13, wherein said proportional current generation circuit utilizes the current flowing from the current control circuit to the bias current generation use resistance as a bias current.

18. The differential amplifier circuit as claimed in claim 13, wherein said bias current generation use resistance is made of the same material as the adjustment resistance and is manufactured in the same process.

19. The differential amplifier circuit as claimed in claim 13, wherein values of said resistances of the adjustment resistance are calculated by $K \times 2^n$, wherein K represents the minimum resistance value and n represents an integral number.

* * * * *